United States Patent

[11] 3,571,616

[72] Inventor John R. Andrews
Framingham, Mass.

[21] Appl. No. 834,360
[22] Filed June 18, 1969
[45] Patented Mar. 23, 1971

[73] Assignee Honeywell Inc.,
Minneapolis, Minn.

[54] LOGIC CIRCUIT
5 Claims, 2 Drawing Figs.

[52] U.S. Cl. .......... 307/215, 307/214, 307/218, 307/263, 307/285, 307/299, 307/300, 307/320
[51] Int. Cl. .......... H03k 19/00, H03k 5/12
[50] Field of Search .......... 307/263, 299 (A), 300, 285, 320, 215, 218, 214; 328/185

[56] References Cited
UNITED STATES PATENTS

| | | | |
|---|---|---|---|
| 3,218,472 | 11/1965 | Ruoff .......... | 307/320 |
| 3,506,846 | 4/1970 | Niemann .......... | 307/215 |
| 3,522,444 | 8/1970 | Lourie .......... | 307/215 |

OTHER REFERENCES

Atwood, IBM Tech. Disclosure Bulletin, Vol. 8, No. 2, July, 1965 pp 317— 318. 307/215

*Primary Examiner*—Donald D. Forrer
*Assistant Examiner*—David M. Carter
*Attorneys*—Fred Jacob, David M. Driscoll and W. Hugo Liepmann

ABSTRACT: A semiconductor logic circuit adapted for fabrication as a monolithic circuit component. The circuit includes a multiemitter input transistor coupled to a phase splitter transistor which, in turn, connects to a pair of complementary operated output transistors. The circuit further includes slope control circuitry integrally fabricated therein.

INVENTOR
JOHN R. ANDREWS
BY
David M. Driscoll
ATTORNEY

LOGIC CIRCUIT

BACKGROUND OF THE INVENTION

The present invention is concerned with a monolithic semiconductor logic circuit adapted for use in digital logic applications. The present invention is more particularly concerned with such a logic circuit wherein additional circuitry is provided for slope control.

Generally speaking, slope control is used in logic circuitry to prevent undesired noise pulses from being induced in other local circuitry. This noise or crosstalk is caused by the rapid rise and fall times of the pulses generated at the output of the logic circuit. Nowadays there exist different techniques for controlling the slope of the output pulse of logic circuits. Usually this is accomplished by external means, particularly when the logic circuit is of an integrated type. Additionally, present logic circuits that use slope control do not produce, in a simple manner, output pulses having linear rise and fall times. Also, the need for circuitry, external to the logic chip, to provides slope control is costly and many times calls for additional pin connections.

It is therefore an object of the present invention to provide a logic circuit including slope control circuitry.

It is a further object of the present invention to provide a logic circuit that integrally includes slope control circuitry, that can be fabricated in a simple manner and at low cost.

It is still a further object of the present invention to provide a logic circuit adapted to produce an output pulse whose rise and fall times are substantially linear.

SUMMARY OF THE INVENTION

These and other objects are attained in the present invention which overcomes the above-mentioned problems by providing linear slope control, without the use of complex external circuitry. The logic circuit which constitutes the subject matter of this invention includes an input transistor gate coupled to a phase splitter transistor. The output from the phase splitter transistor is coupled to complementary output switching means. The logic circuit further includes slope control circuit that is adapted to provide an output pulse from the logic circuit that has substantially linear rise and fall times.

The foregoing objects and features of novelty which characterize the invention as well as other objects of the invention are pointed out with particularity in the claims annexed to and forming part of the present specification. For a better understanding of the invention, its advantages and specific objects obtained with its use, reference is directed to the accompanying drawings in which:

FIG. 1 is a preferred embodiment of the logic circuit of the present invention; FIG. 2 is a voltage-capacitance curve of a typical PN junction capacitor such as is shown in FIG. 1.

DETAILED DESCRIPTION

Figure 1:
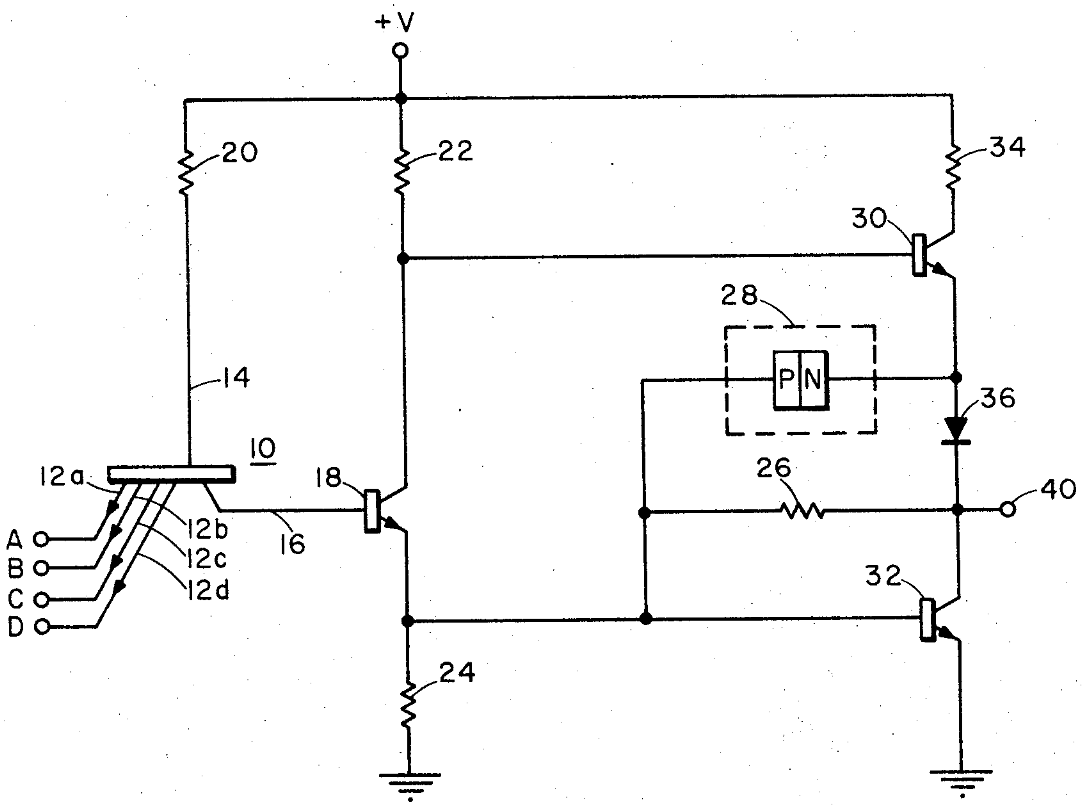

Referring to FIG. 1, the illustrated logic circuit includes multi emitter transistor 10, phase splitter transistor 18 and complementary transistors 30 and 32. Multiemitter transistor 10 has a base electrode 14, a collector electrode 16 and four separate emitter electrodes 12*a*, 12*b*, 12*c* and 12*d* each of which is connected to a separate one of the logic circuits input terminals A, B, C and D. The base 14 of transistor 10 is connected to a resistor 20 which, in turn is connected to positive power source $+V$. Collector electrode 16 of transistor 10 is connected to the base electrode of transistor 18, the collector and emitter electrodes of transistor 18 are, respectively, coupled by way of resistor 22 to positive power source $+V$, and by way of resistor 24 to ground.

The collector electrode of transistor 18 is coupled to the base electrode of transistor 30, while the emitter electrode of transistor 18 is coupled to the base electrode of transistor 32. Transistors 30 and 32 form the complementary output transistors of the logic circuit. Resistor 34 connects from the collector electrode of transistor 30 to positive power source $+V$, and the emitter of transistor 30 connects via diode 36 to the collector electrode of transistor 32. The emitter of transistor 32 is coupled to ground while the cathode of diode 36 is connected to the collector electrode of transistor 32. Resistor 26 is coupled between the base and collector electrodes of transistor 32; the collector electrode of transistor 32 also connecting to the output terminal 40. Finally, PN junction capacitor 28 couples between the emitter electrode of transistor 18 and the emitter electrode of transistor 30.

The operation of the logic circuit described above is best explained by assigning representative voltage values to the signals applied to the circuit. The voltage of positive power source $+V$ is preferably in the order of 5.0 volts, while the logic signals applied to the terminals A—D have a nominal low voltage level of 0.2 volts and a nominal high voltage level of 3.4 volts. Reference will be made to the base-emitter voltage $V_{be}$ required to energize the circuit transistors, which voltage for each transistor is in the order of 0.8 volts. Reference will also be made to the voltage $V_{ce}$ which is established across the collector-emitter elements of the fully-energized, i.e. saturated, transistors which voltage for each transistor is typically in the order of 0.2 volts. Since the aforementioned input signal levels and transistor voltage parameters are merely representative values, they should not be construed to limit the scope of the invention. It will be initially assumed that at least one of the logic signals applied to the input terminals A—D, is at its low voltage level of 0.2 volts. Transistor 10 will therefore be conducting current through at least one of its base-emitter junctions, causing its collector to assume value of $V_{in}+V_{ce}$ volts or approximately 0.4 volts. This voltage value is far below the 2 $V_{be}$ volts, or 1.6 volts required to activate the transistors 18 and 32. The voltage at the emitter electrode of transistor 18 is not sufficiently positive to energize transistor 32. Transistor 32 is, therefore, essentially disconnected from output terminal 40. The voltage on the collector electrode of transistor 18, however, approaches the potential of positive power source $+V$, or 5 volts. Transistor 30 therefore conducts and causes output terminal 40 to assume a value of $+V$ minus $V_{be}$ volts minus the diode 36 voltage drop, or approximately 3.4 volts. For this particular condition, PN junction capacitor 28 is reverse-biased and its capacitance value is in the vicinity of 22 pf. In addition, the series combination or resistors 24 and 26 provide a slight positive bias on the base of transistor 32, reducing circuit delay time when transistor 32 is subsequently turned on.

It will now be assumed that all logic signals applied to the input terminals A—D revert to their high-voltage levels, 3.4 volts. Current flows through the base-collector junction of transistor 10 and through the base-emitter junctions of transistors 18 and 32, rendering them conductive. The collector electrode of transistor 18 goes negative turning transistor 30 off and the voltage at output terminal 40 starts towards ground. The value of capacitor 28 and the excess base drive current of transistor 32 determines the fall time of the output pulse at terminal 40. Without the presence of diode 36, p-n junction capacitor 28 would be forward biased and would be of a substantially high capacitance value when transistor 32 is saturated. In other words, capacitor 28 would not be operating in the reverse biased region of its voltage-capacitance curve. This would cause the output waveform generated at output terminal 40 to be nonlinear when switching from the 3.4 volt level to the 0.2 volt level. The presence of diode 36, however, assures that PN junction capacitor 28 is sufficiently reverse-biased, when transistor 32 is saturated to maintain capacitor 28 in a more linear region of its voltage-capacitance curve, thereby providing an approximately linear fall time for the output pulse generated at output terminal 40.

When one of the input signals again reverts to a low voltage state, transistor 10 will again conduct and transistor 18 will turn off. The collector electrode at transistor 18 will rapidly go positive and transistor 30 will turn on. The p-n capacitor 28 remains reverse-biased and the slope of the rising output pulse is determined primarily by the values of capacitor 28 and resistor 24. Transistor 32 starts to turn off as soon as transistor 18 turns off and the output pulse experiences a transition from a 0.2 volt level to a level of approximately 3.4 volts. This transition in a positive sense is approximately linear.

Figure 2:
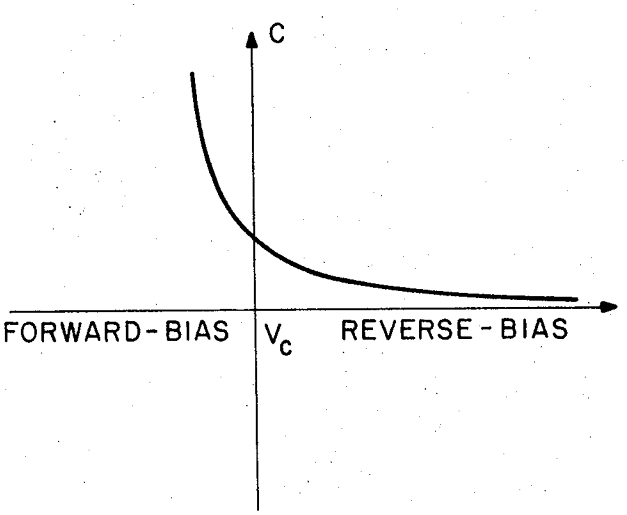

Referring to FIG. 2, herein is shown a typical voltage capacitance curve of PN junction capacitor 28. It is noted from observing FIG. 2 that in the reverse-biased direction, the capacitance value changes very little and approaches a fairly linear relationship. The placement of diode 36 as shown in FIG. 1 allows operation of p-n junction capacitor 28 over this reverse biased region, thereby providing rise and fall times that are substantially more linear than without the use of diode 36, connected as shown.

The circuit of the present invention, therefore does attain the aforementioned objects by integrally providing slope control circuitry and by additionally providing a circuit arrangement that produces an output pulse having substantially linear rise and fall times.

I claim:

1. A logic circuit comprising:

a. a transistor gating means having a plurality of input terminals and an output terminal;

b. a phase splitter transistor having its base electrode coupled to the output terminal of said transistor gating means and adapted to receive signals from said transistor gating means;

c. an emitter resistor connecting the emitter electrode of said phase splitter transistor to a reference point;

d. an output terminal;

e. a source of DC potential;

f. first and second complementary operated transistor switching means connected in series through said output terminal, said series connected switching means being coupled between said source of DC potential and said reference point, said first transistor switching means having its input coupled to the collector electrode of said phase splitter transistor and said second transistor switching means having its input coupled to the emitter electrode of said phase splitter transistor;

g. a PN junction capacitor coupled between the emitter electrode of said phase splitter transistor and the emitter electrode of said first transistor switching means; and h. a diode connected between said first and second transistor switching means, said diode being adapted to provide operation for said capacitor over the substantially reverse-biased region of the voltage capacitance curve of said capacitor.

2. A logic circuit as defined in claim 1 wherein the anode of said diode connects to one side of said p-n junction capacitor.

3. A logic circuit as defined in claim 1 and further comprising a feedback resistor connected between said output terminal and the emitter electrode of said phase splitter transistor to form a voltage divider with said emitter resistor, said feedback resistor being adapted to bias said second transistor switching means to a point immediately below the switching threshold of said second transistor switching means.

4. A logic circuit comprising:

a. a multiple emitter transistor having its base electrode coupled to a DC power source;

b. a plurality of input terminals each one connected to a separate emitter of said multiple emitter transistor and each adapted to receive a bi-level logic signal;

c. a phase splitter transistor having its base coupled to the collector electrode of said multiple emitter transistor, its collector electrode coupled to a power source and its emitter electrode coupled to ground;

d. a third transistor having its base coupled to the collector electrode of said phase splitter transistor and its collector electrode coupled to said power source;

e. a fourth transistor having its emitter electrode grounded and its base electrode coupled from the emitter electrode of said phase splitter transistor;

f. a PN junction capacitor coupled between the emitter electrode of said phase splitter transistor and the emitter electrode of said third transistor; and g. a diode connecting between the emitter electrode of said third transistor and the collector electrode of said fourth transistor, said diode being adapted to provide operation for said capacitor over the substantially reverse biased region of the voltage capacitance curve of said capacitor.

5. A logic circuit as defined in claim 4 further comprising a first resistor connecting between the collector electrode of said fourth transistor and the emitter electrode of said phase splitter transistor, and a second resistor connected between the emitter electrode of said phase splitter transistor and ground, said first and second resistors adapted to bias said fourth transistor into a state near conduction when said fourth transistor is substantially off.